United States Patent
Hong et al.

(10) Patent No.: US 11,805,690 B2
(45) Date of Patent: Oct. 31, 2023

(54) DISPLAY DEVICE INCLUDING ANTI-REFLECTION LAYERS TO TRANSMIT DIFFERENT COLORED LIGHT

(71) Applicant: Samsung Display Co., Ltd., Yongin-si (KR)

(72) Inventors: Jongbeom Hong, Seongnam-si (KR); Reehyang Kim, Hwaseong-si (KR); Yongsub Shim, Gwangmyeong-si (KR); Youngjun Yoo, Goyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 260 days.

(21) Appl. No.: 17/235,666

(22) Filed: Apr. 20, 2021

(65) Prior Publication Data
US 2022/0077241 A1 Mar. 10, 2022

(30) Foreign Application Priority Data
Sep. 10, 2020 (KR) .................. 10-2020-0116160

(51) Int. Cl.
*H01L 51/52* (2006.01)
*H10K 59/30* (2023.01)
*H10K 50/86* (2023.01)

(52) U.S. Cl.
CPC .......... *H10K 59/30* (2023.02); *H10K 50/865* (2023.02)

(58) Field of Classification Search
CPC ...... H10K 59/30; H10K 50/865; H10K 50/86; H10K 50/85; H10K 59/35; H10K 59/122; H10K 59/353
See application file for complete search history.

(56) References Cited

U.S. PATENT DOCUMENTS

| 10,948,628 B1* | 3/2021 | Demiryont .............. G02F 1/155 |
| 2011/0164210 A1* | 7/2011 | Tsuda ..................... H10K 50/86 |
| | | 359/488.01 |
| 2019/0004616 A1* | 1/2019 | Baek ...................... H03K 17/96 |
| 2021/0376295 A1* | 12/2021 | Zhou ................... H10K 50/852 |

FOREIGN PATENT DOCUMENTS

| KR | 10-2013-0081575 A | 7/2013 | |
| KR | 20140107091 A * | 9/2014 | ....... G02F 1/133502 |
| KR | 10-1616918 B1 | 4/2016 | |
| KR | 10-2017-0137760 A | 12/2017 | |

OTHER PUBLICATIONS

English Machine Translation of KR-20140107091 (Year: 2023).*

* cited by examiner

*Primary Examiner* — Donald L Raleigh
(74) *Attorney, Agent, or Firm* — Lewis Roca Rothgerber Christie LLP

(57) ABSTRACT

A display device includes: a first substrate including a first region, a second region adjacent to the first region, and a third region adjacent to the second region; a plurality of emission layers on the first substrate; a first anti-reflection layer on the plurality of emission layers, and to transmit a first colored light; a second anti-reflection layer on the plurality of emission layers, and to transmit a second colored light and a third colored light that are different from the first colored light; and a second substrate on the first anti-reflection layer and the second anti-reflection layer.

20 Claims, 9 Drawing Sheets

DISPLAY DEVICE INCLUDING ANTI-REFLECTION LAYERS TO TRANSMIT DIFFERENT COLORED LIGHT

CROSS-REFERENCE TO RELATED APPLICATION

This application claims priority to and the benefit of Korean Patent Application No. 10-2020-0116160, filed on Sep. 10, 2020 in the Korean Intellectual Property Office (KIPO), the entire disclosure of which is incorporated by reference herein.

BACKGROUND

1. Field

Aspects of one or more embodiments of the present disclosure relate to a display device, and more particularly, to a display device including an anti-reflection layer.

2. Description of the Related Art

A glass substrate may be used for a flat panel display, and is a material having light weight, excellent transmittance, and flatness. However, the glass substrate may include a surface that has a large reflectance of light, which may decrease visibility of an image displayed on the glass substrate.

The above information disclosed in this Background section is for enhancement of understanding of the background of the present disclosure, and therefore, it may contain information that does not constitute prior art.

SUMMARY

A method of reducing such decrease in visibility due to the surface reflection, and increasing a contrast ratio thereof, may include removing or reducing light reflected from the surface of the glass substrate, for example, such as by using an anti-reflection ("AR") coating method. The anti-reflection ("AR") coating method is a method of reducing reflection by the surface, and increasing light transmittance thereof, by attaching an anti-reflective coating layer to the surface of the glass substrate.

One or more embodiments of the present disclosure are directed to a display device including an anti-reflection layer.

According to one or more embodiments of the present disclosure, a display device includes: a first substrate including a first region, a second region adjacent to the first region, and a third region adjacent to the second region; a plurality of emission layers on the first substrate; a first anti-reflection layer on the plurality of emission layers, and configured to transmit a first colored light; a second anti-reflection layer on the plurality of emission layers, and configured to transmit a second colored light and a third colored light that are different from the first colored light; and a second substrate on the first anti-reflection layer and the second anti-reflection layer.

In an embodiment, the plurality of emission layers may include: a first emission layer configured to emit red light, and overlapping with the first region; a second emission layer configured to emit green light, and overlapping with the second region; and a third emission layer configured to emit blue light, and overlapping with the third region.

In an embodiment, the first anti-reflection layer may overlap with the first region, and may contact the second substrate; and the second anti-reflection layer may overlap with the second region and the third region, and may contact the second substrate.

In an embodiment, the first color may be red, the second color may be green, and the third color may be blue.

In an embodiment, the first anti-reflection layer may overlap with the first region, and may contact the second anti-reflection layer; and the second anti-reflection layer may overlap with the first region, the second region, and the third region, and may contact the second substrate.

In an embodiment, the second anti-reflection layer may be further configured to transmit the first colored light.

In an embodiment, the first color may be red, the second color may be green, and the third color may be blue.

In an embodiment, a material included in the first anti-reflection layer and a material included in the second anti-reflection layer may be different from each other.

In an embodiment, a thickness of the first anti-reflection layer and a thickness of the second anti-reflection layer may be different from each other.

In an embodiment, a thickness of the first anti-reflection layer and a thickness of the second anti-reflection layer may be the same as each other.

In an embodiment, at least one of the first anti-reflection layer or the second anti-reflection layer may include a plurality of layers.

In an embodiment, the plurality of layers may have different refractive indices from one another.

According to one or more embodiments of the present disclosure, a display device includes: a first substrate including a first region, a second region adjacent to the first region, and a third region adjacent to the second region; a plurality of emission layers on the first substrate; a first anti-reflection layer on the plurality of emission layers, and configured to transmit a first colored light; a second anti-reflection layer on the plurality of emission layers, and configured to transmit a second colored light that is different from the first colored light; a third anti-reflection layer on the plurality of emission layers, and configured to transmit a third colored light that is different from the first colored light and the second colored light; and a second substrate on the first anti-reflection layer, the second anti-reflection layer, and the third anti-reflection layer.

In an embodiment, the plurality of emission layers may include: a first emission layer configured to emit red light, and overlapping with the first region; a second emission layer configured to emit green light, and overlapping with the second region; and a third emission layer configured to emit blue light, and overlapping with the third region.

In an embodiment, the first anti-reflection layer may overlap with the first region, and may contact the second substrate; the second anti-reflection layer may overlap with the second region, and may contact the second substrate; and the third anti-reflection layer may overlap with the third region, and may contact the second substrate.

In an embodiment, the first color may be red, the second color may be green, and the third color may be blue.

In an embodiment, a material included in the first anti-reflection layer, a material included in the second anti-reflection layer, and a material included in the third anti-reflection layer may be different from one another.

In an embodiment, a thickness of the first anti-reflection layer, a thickness of the second anti-reflection layer, and a thickness of the third anti-reflection layer may be different from one another.

In an embodiment, a thickness of the first anti-reflection layer, a thickness of the second anti-reflection layer, and a thickness of the third anti-reflection layer may be the same as each other.

In an embodiment, at least one of the first anti-reflection layer, the second anti-reflection layer, or the third anti-reflection layer may include a plurality of layers; and the plurality of layers may have different refractive indices from one another.

According to one or more embodiments of the present disclosure, the display device may include an anti-reflection layer attached to a lower surface of the second substrate. Accordingly, the reflectance of light emitted from the organic light emitting diode with respect to the lower surface of the second substrate may be reduced, interference between the light emitted from the organic light emitting diode and the lower surface of the second substrate may be reduced, and color shift ("WAD") of a rainbow type may be reduced.

However, the present disclosure is not limited to such aspects and features, and other aspects and features of the present disclosure may be described in the description that follows, or may be realized by practicing one or more of the presented embodiments of the present disclosure.

BRIEF DESCRIPTION OF THE DRAWINGS

The above and other aspects and features of the present disclosure will become more apparent to those skilled in the art from the following detailed description of the example embodiments with reference to the accompanying drawings.

DETAILED DESCRIPTION

Figure 1:
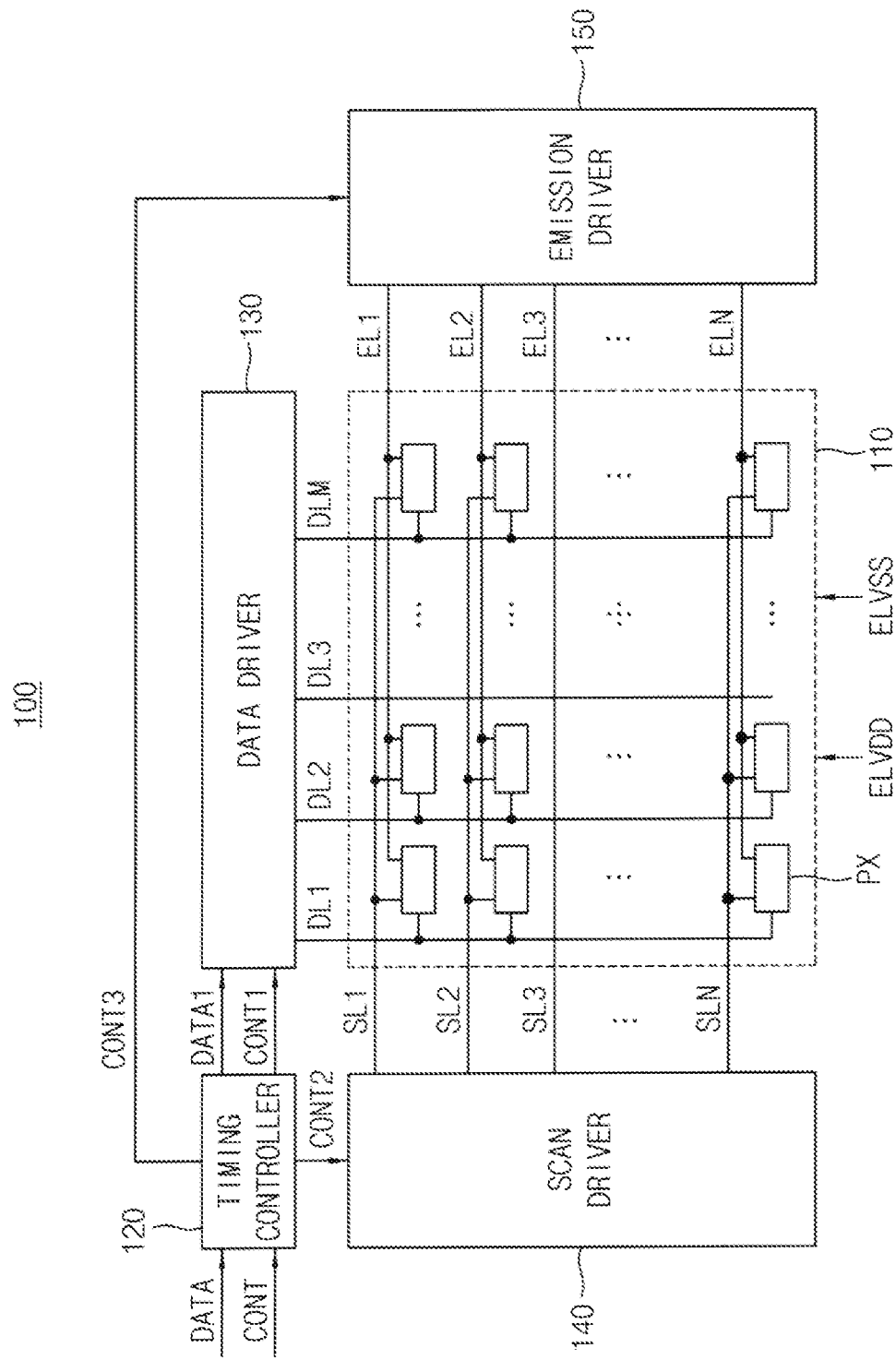
FIG. 1 is a block diagram illustrating a display device according to one or more embodiments.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram illustrating a display device according to one or more embodiments.

Referring to FIG. 1, the display device 100 may include a display unit (e.g., a display panel or a display layer) 110, a timing controller 120, a data driver 130, a scan driver 140, and an emission driver 150.

The display unit 110 may include a plurality of sub-pixels PX. The plurality of sub-pixels PX may be connected to a plurality of scan lines SL1, SL2, SL3, . . . , SLN, a plurality of data lines DL1, DL2, DL3, . . . , DLM, and a plurality of emission control lines EL1, EL2, EL3, . . . , ELN (where N and M are natural numbers greater than 1).

The data lines DL1, DL2, DL3 . . . , DLM may be connected to the data driver 130 to transmit data voltages to the sub-pixels PX. The scan lines SL1, SL2, SL3, SLN may be connected to the scan driver 140 to transmit scan signals to the sub-pixels PX. The emission control lines EL1, EL2, EL3, . . . , ELN may be connected to the emission driver 150 to transmit emission control signals to the sub-pixels PX.

The sub-pixels PX may receive a driving voltage ELVDD, and a common voltage ELVSS. Each of the sub-pixels PX may receive the data voltage in response to the scan signal, and may generate light having a grayscale (e.g., a gray level) corresponding to the data voltage by using the driving voltage ELVDD and the common voltage ELVSS.

The data driver 130 may convert a first data signal DATA1 into the data voltage in response to a first control signal CONT1, and may output the data voltage to the data lines DL1, DL2, DL3, . . . , DLM.

The scan driver 140 may generate the scan signal in response to a second control signal CONT2.

The emission driver 150 may generate the emission control signal in response to a third control signal CONT3.

The timing controller 120 may receive a data signal DATA and a control signal CONT from an external device. In one or more embodiments, the data signal DATA may include red image data, green image data, and blue image data. The control signal CONT may include a horizontal synchronization signal, a vertical synchronization signal, and a main clock signal.

The timing controller 120 may generate the first control signal CONT1 for driving the data driver 130, the second control signal CONT2 for driving the scan driver 140, and the third control signal CONT3 for driving the emission driver 150 based on the control signal CONT.

Figure 2:
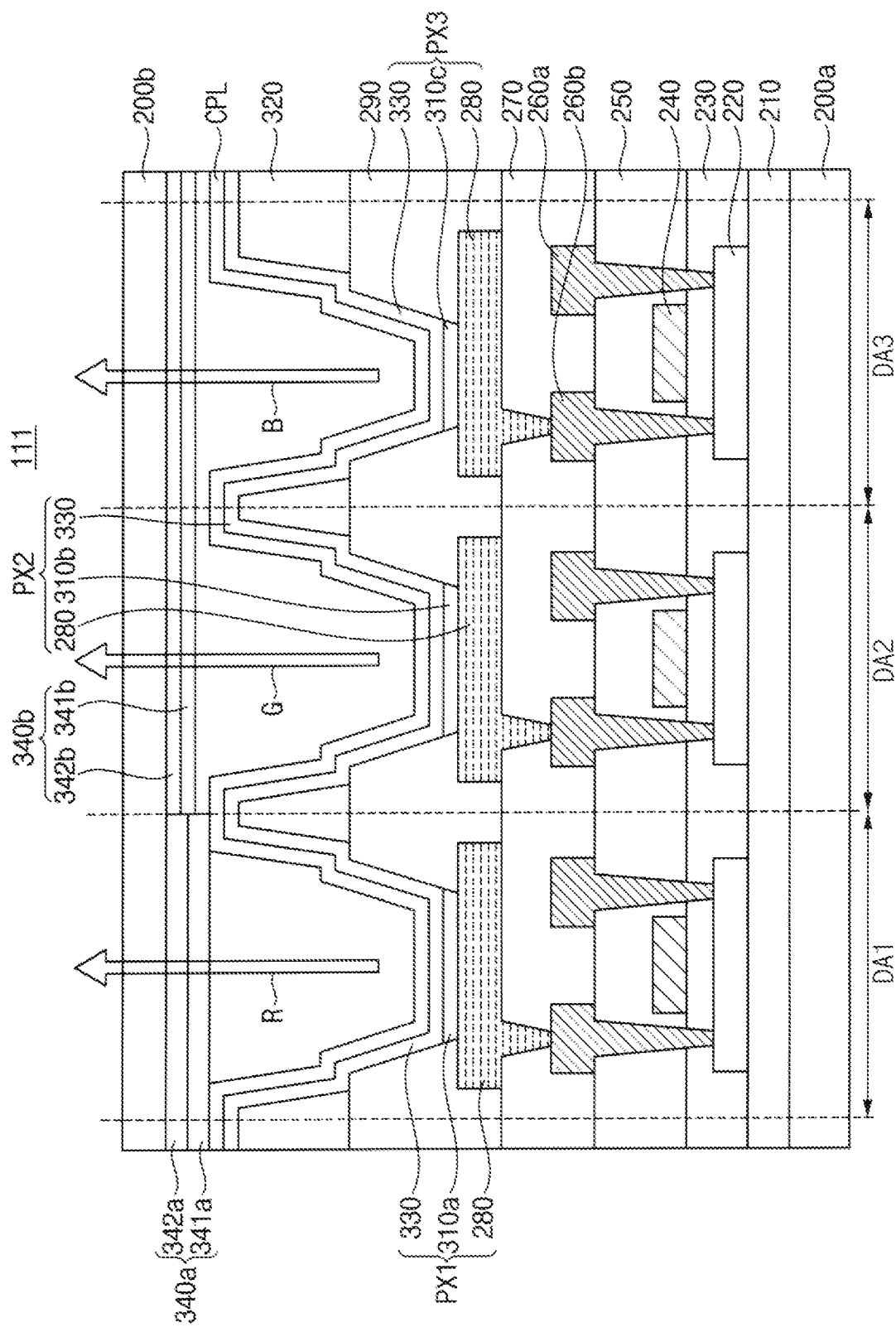
FIG. 2 is a cross-sectional view illustrating an example of a display unit included in the display device of FIG. 1.
Figure 3:
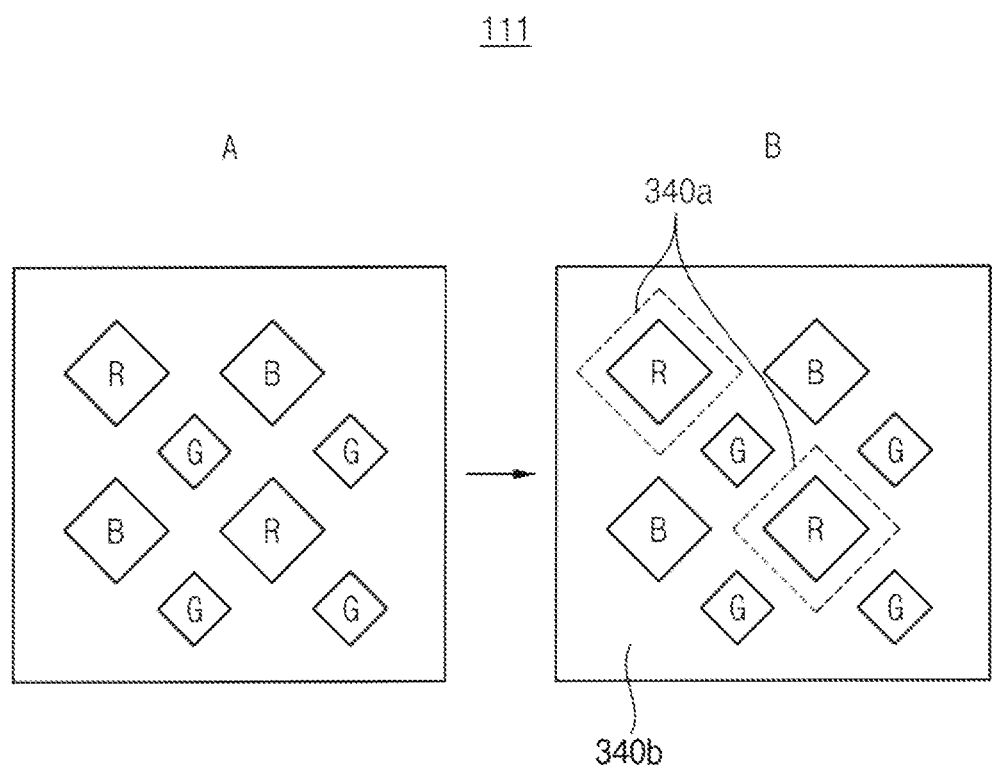
FIG. 3 is a plan view illustrating the display unit of FIG. 2.

FIG. 2 is a cross-sectional view illustrating an example of a display unit included in the display device of FIG. 1. FIG. 3 is a plan view illustrating the display unit of FIG. 2.

Referring to FIG. 2, a display unit (e.g., a display panel or a display layer) 111 may include a first substrate 200a, a source electrode 260a, a drain electrode 260b, a buffer layer 210, an active layer 220, a gate electrode 240, a gate insulating layer 230, an interlayer insulating layer 250, a lower electrode 280, a via layer 270, first to third emission layers 310a, 310b, and 310c, an upper electrode 330, a capping layer CPL, a pixel defining layer 290, a spacer 320, a second substrate 200b, a first anti-reflection layer 340a, and a second anti-reflection layer 340b.

The display unit 111 may include the plurality of sub-pixels PX. The sub-pixels PX may include a first sub-pixel PX1, a second sub-pixel PX2, and a third sub-pixel PX3.

The first sub-pixel PX1 may include the lower electrode 280, the first emission layer 310a, and the upper electrode 330. The second sub-pixel PX2 may include the lower electrode 280, the second emission layer 310b, and the upper electrode 330. The third sub-pixel PX3 may include the lower electrode 280, the third emission layer 310c, and the upper electrode 330.

The first substrate 200a may include a first area DA1, a second area DA2, and a third area DA3. The first substrate 200a may include a transparent material or an opaque material. For example, the first substrate 200a may include a quartz substrate, a synthetic quartz substrate, a calcium fluoride substrate, a soda lime glass substrate, an alkali-free glass substrate, and/or the like.

The first sub-pixel PX1 may overlap with the first area DA1, the second sub-pixel PX2 may overlap with the second area DA2, and the third sub-pixel PX3 may overlap with the third area DA3.

The buffer layer 210 may be disposed on the first substrate 200a. The buffer layer 210 may include an inorganic material, for example, such as an oxide or a nitride. The buffer layer 210 may prevent or substantially prevent diffusion of metal atoms and/or impurities from the first substrate 200a to a thin film transistor.

The thin film transistor may be disposed on the buffer layer 210 for each of the first sub-pixel PX1, the second sub-pixel PX2, and the third sub-pixel PX3. The thin film transistor may include the active layer 220, the gate electrode 240, the source electrode 260a, and the drain electrode 260b.

The active layer 220 may be disposed on the buffer layer 210. The active layer 220 may include a silicon semiconductor or an oxide semiconductor. In an embodiment, the active layer 220 may include the silicon semiconductor including polysilicon. In another embodiment, the active layer 220 may include the oxide semiconductor including indium ("In"), zinc ("Zn"), gallium ("Ga"), tin ("Sn"), titanium ("Ti"), aluminum ("Al"), hafnium ("Hf"), zirconium ("Zr"), magnesium ("Mg"), and/or the like.

The gate insulating layer 230 may be disposed on the buffer layer 210. The gate insulating layer 230 may cover the active layer 220. The gate insulating layer 230 may include silicon oxide ("SiOx"), silicon nitride ("SiNx"), silicon carbide ("SiCx"), or a combination thereof.

The gate electrode 240 may be disposed on the gate insulating layer 230. The gate electrode 240 may be disposed to overlap with the active layer 220. The gate electrode 240 may include a metal, for example, such as aluminum ("Al"), silver ("Ag"), chromium ("Cr"), titanium ("Ti"), tantalum ("Ta"), molybdenum ("Mo"), and/or the like, or any suitable alloys thereof, nitrides thereof, a conductive metal oxide, a transparent conductive material, and/or the like.

The interlayer insulating layer 250 may be disposed on the gate insulating layer 230. The interlayer insulating layer 250 may cover the gate electrode 240. The interlayer insulating layer 250 may include silicon oxide, silicon nitride, silicon oxynitride, and/or the like. In an embodiment, the interlayer insulating layer 250 may be formed as a single layer including a single material.

The source electrode 260a and the drain electrode 260b may be disposed on the interlayer insulating layer 250. The source electrode 260a and the drain electrode 260b may pass through (e.g., may penetrate) the gate insulating layer 230 and the interlayer insulating layer 250, and may contact the active layer 220. Accordingly, the source electrode 260a and the drain electrode 260b may be electrically connected to the active layer 220.

The via layer 270 may be disposed on the interlayer insulating layer 250. The via layer 270 may cover the source electrode 260a and the drain electrode 260b. The via layer 270 may include an organic insulating material, for example, such as phenol resin, acrylic resin, polyimide resin, polyamide resin, siloxane resin, epoxy resin, and/or the like.

The lower electrode 280 may be disposed on the via layer 270. The lower electrode 280 may pass through (e.g., may penetrate) the via layer 270, and may be electrically connected to the drain electrode 260b.

The pixel defining layer 290 may be disposed on the via layer 270. The pixel defining layer 290 may have an opening exposing at least a portion of the lower electrode 280. For example, the pixel defining layer 290 may include an organic insulating material.

An emission layer may be disposed on the lower electrode 280. The emission layer may include the first emission layer 310a, the second emission layer 310b, and the third emission layer 310c. The first emission layer 310a may overlap with the first area DA1, the second emission layer 310b may overlap with the second area DA2, and the third emission layer 310c may overlap with the third area DA3.

In an embodiment, the first emission layer 310a may emit red light R, the second emission layer 310b may emit green light G, and the third emission layer 310c may emit blue light B. The first to third emission layers 310a, 310b, and 310c may include one or more (e.g., at least one) of various suitable functional layers, for example, such as a hole injection layer, a hole transport layer, an organic emission layer, an electron transport layer, and/or an electron injection layer, in a single layer structure or a multilayered structure. The first to third emission layers 310a, 310b, and 310c may include a low molecular weight organic compound, or a high molecular weight organic compound.

The spacer 320 may be disposed on the pixel defining layer 290. The spacer 320 may be disposed to be adjacent to the outside of the opening of the pixel defining layer 290.

The upper electrode 330 may be disposed on the first to third emission layers 310a, 310b, 310c. In more detail, the upper electrode 330 may be disposed to cover the first to third emission layers 310a, 310b, and 310c, the pixel defining layer 290, and the spacer 320 as a whole. In an embodiment, the upper electrode 330 may continuously extend in the display unit 111 over a plurality of the sub-pixels PX shown in FIG. 1.

The capping layer CPL for protecting the upper electrode 330 may be disposed on the upper electrode 330. The capping layer CPL may be entirely disposed on the upper electrode 330. In an embodiment, the capping layer CPL may continuously extend in the display unit 111 over the plurality of sub-pixels PX shown in FIG. 1. For example, the capping layer CPL may include an organic insulating material and/or an inorganic insulating material.

The lower electrode 280, the first to third emission layers 310a, 310b, and 310c, and the upper electrode 330 may be defined as (e.g., may form or may be included in) an organic light emitting diode.

An air gap may exist (e.g., may be included or may be formed) between the capping layer CPL and the second substrate 200b.

According to a viewing angle of a user who is viewing the display device 100, a color shift in which different colors are visually recognizable may occur. For example, when the air gap exists, an interference may occur between the light emitted from the organic light emitting diode and a lower surface of the second substrate 200b, and the color shift of a rainbow type may occur due to the interference.

In an embodiment, the first anti-reflection layer 340a and the second anti-reflection layer 340b may be disposed on the capping layer CPL. The first anti-reflection layer 340a and the second anti-reflection layer 340b may increase a light transmittance of the light emitted from the organic light emitting diode. Accordingly, the reflectance of the light emitted from the organic light emitting diode with respect to the second substrate 200b may be reduced, an interference between the light emitted from the organic light emitting diode and the lower surface of the second substrate 200b may be reduced, and the color shift of the rainbow type may be reduced.

As shown in FIG. 3, an enlarged view A may be a plan view of the display device 100 before the first anti-reflection layer 340a and the second anti-reflection layer 340b are disposed on the capping layer CPL, and an enlarged view B may be a plan view of the display device 100 after the first anti-reflection layer 340a and the second anti-reflection layer 340b are disposed on the capping layer CPL.

In an embodiment, the first anti-reflection layer 340a may overlap with the first area DA1, and the second anti-reflection layer 340b may overlap with the second area DA2 and the third area DA3. The first anti-reflection layer 340a may transmit light of a first color therethrough, and the second anti-reflection layer 340b may transmit light of a second color and light of a third color therethrough. For example, the first anti-reflection layer 340a may transmit the red light R, and the second anti-reflection layer 340b may transmit the green light G and the blue light B.

In an embodiment, each of the first anti-reflection layer 340a and the second anti-reflection layer 340b may include a low refractive oxide, for example, such as silicon dioxide ("$SiO_2$") and/or the like. In another embodiment, each of the first anti-reflection layer 340a and the second anti-reflection layer 340b may include a high refractive oxide, for example, such as titanium dioxide ("$TiO_2$"), zirconium dioxide ("$ZrO_2$"), lithium niobate ("$LiNbO_3$"), lithium tantalate ("$LiTaO_3$"), lanthanum titanium ("$LaTiO_2$"), and/or the like.

In an embodiment, a material included in the first anti-reflection layer 340a and a material included in the second anti-reflection layer 340b may be different from each other.

In an embodiment, a thickness of the first anti-reflection layer 340a and a thickness of the second anti-reflection layer 340b may be different from each other. For example, the thickness of the first anti-reflection layer 340a may be greater than the thickness of the second anti-reflection layer 340b. In another embodiment, the thickness of the first anti-reflection layer 340a may be smaller than the thickness of the second anti-reflection layer 340b.

In another embodiment, the thickness of the first anti-reflection layer 340a and the thickness of the second anti-reflection layer 340b may be the same or substantially the same as each other. In this case, the refractive index of the first anti-reflection layer 340a and the refractive index of the second anti-reflection layer 340b may be different from each other.

At least one of the first anti-reflection layer 340a and/or the second anti-reflection layer 340b may include a plurality of layers. In an embodiment, the plurality of layers may have a stacked structure. For example, the first anti-reflection layer 340a may include a first layer 341a, and a second layer 342a disposed on the first layer 341a. The second anti-reflection layer 340b may include a third layer 341b, and a fourth layer 342b disposed on the third layer 341b. However, the present disclosure is not limited thereto.

The refractive indices of the plurality of layers may be different from one another. For example, a difference in the refractive indices at an interface of the plurality of layers may be about 0.1 or more.

The second substrate 200b may be disposed on the first anti-reflection layer 340a and the second anti-reflection layer 340b.

The first anti-reflection layer 340a and the second anti-reflection layer 340b may contact the second substrate 200b. In more detail, the first anti-reflection layer 340a and the second anti-reflection layer 340b may contact the lower surface of the second substrate 200b.

In an embodiment, the first anti-reflection layer 340a and the second anti-reflection layer 340b may be formed in a coated form or a film form on the lower surface of the second substrate 200b through a chemical vapor deposition ("CVD") process.

Figure 4:
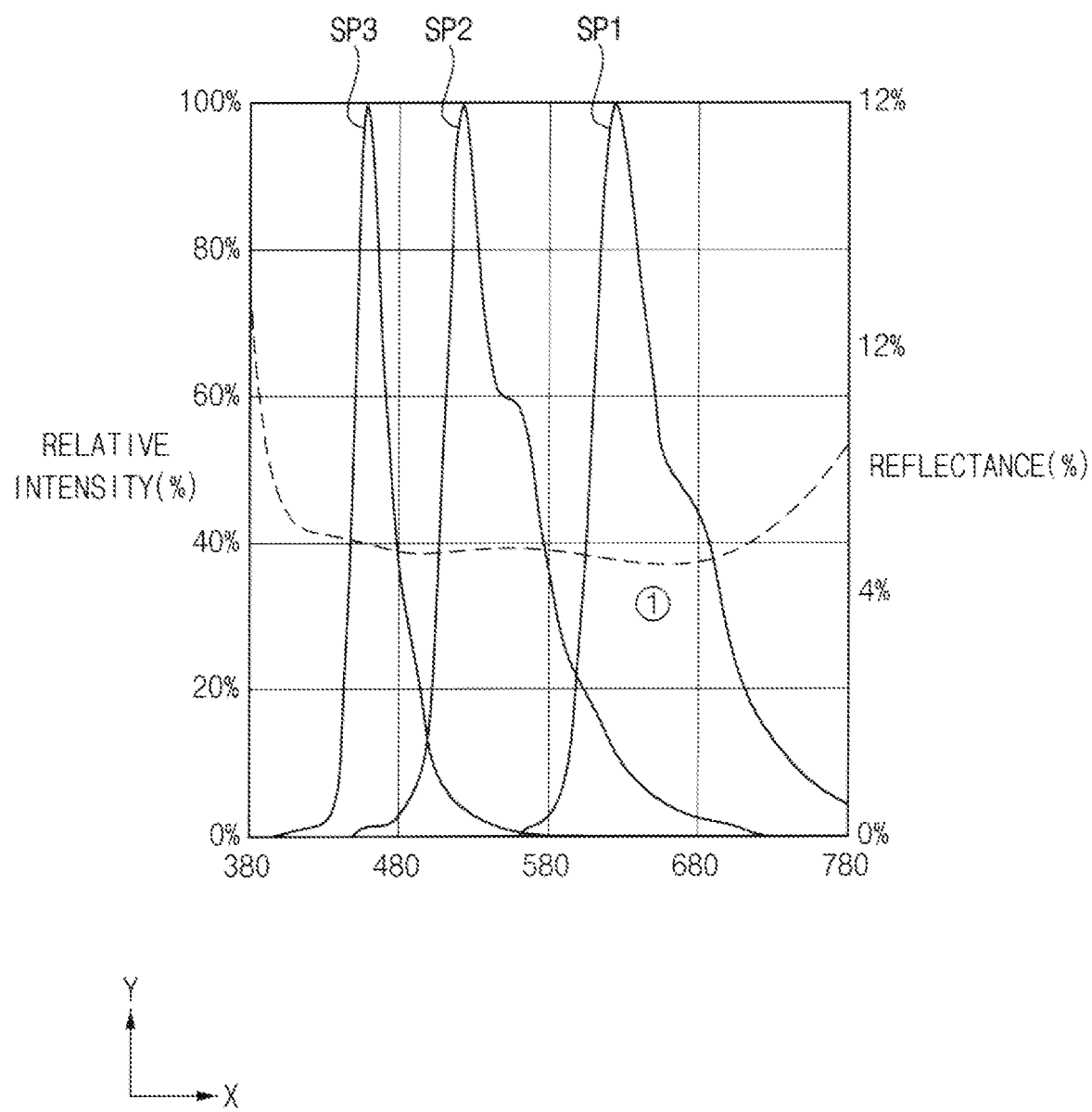
FIG. 4-FIG. 5 are diagrams illustrating a reflectance of light at a lower surface of a second substrate included in a display device according to one or more embodiments.
Figure 5:
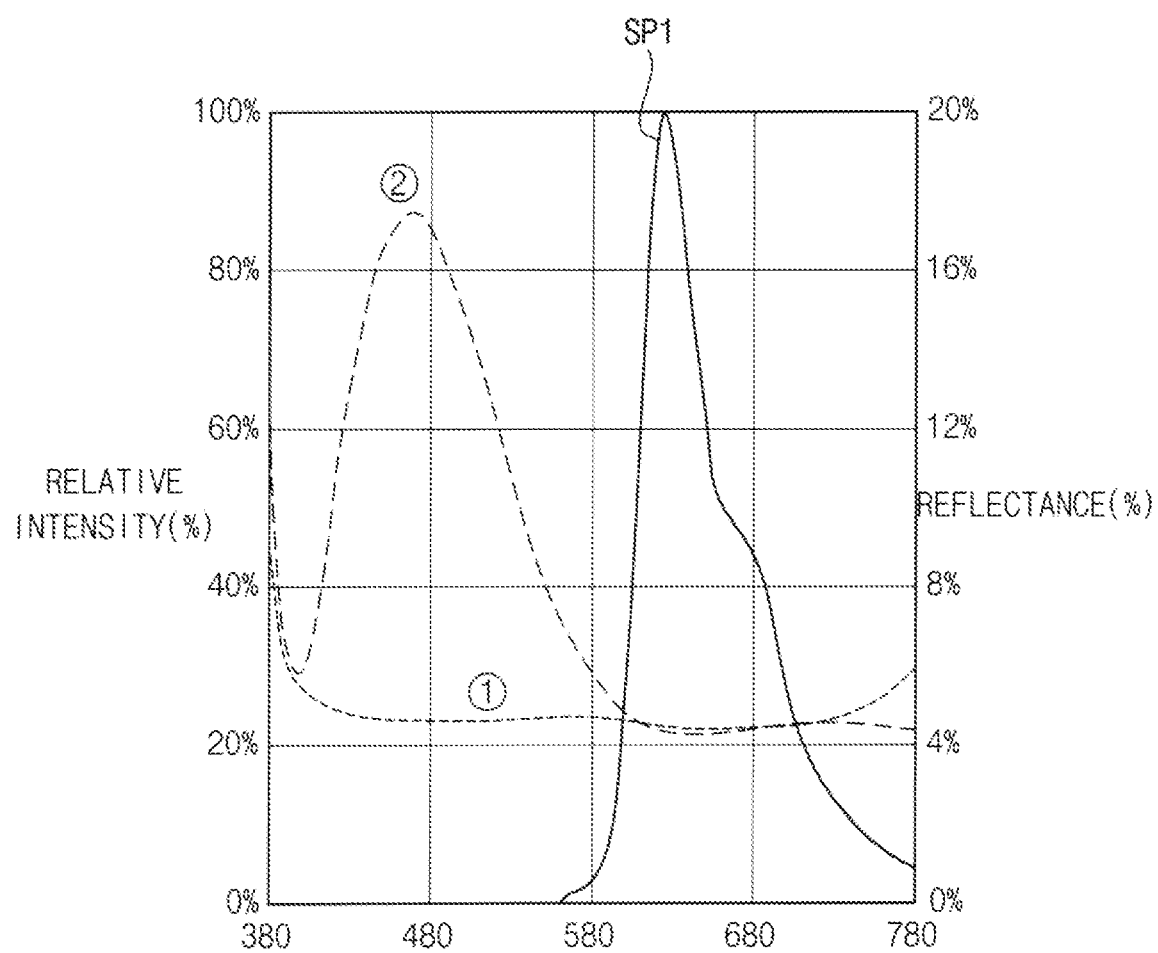

FIG. 4 and FIG. 5 are diagrams illustrating a reflectance of light at a lower surface of a second substrate included in a display device according to one or more embodiments.

Referring to FIG. 4 and FIG. 5, the X axis may represent wavelengths of the red spectrum SP1, the green spectrum SP2, and the blue spectrum SP3. The left side of the Y axis may represent the relative intensity (%) of the red spectrum SP1, the green spectrum SP2, and the blue spectrum SP3, and the right side of the Y-axis may represent the reflectance (%) of light emitted from the organic light emitting diode with respect to the lower surface of the second substrate 200b.

The red spectrum SP1 may have a wavelength of about 610 nm to about 760 nm, the green spectrum SP2 may have a wavelength of about 500 nm to about 560 nm, and the blue spectrum SP3 may have a wavelength of about 435 nm to about 480 nm.

The second anti-reflection layer 340b for transmitting green light G and blue light B may be in contact with the lower surface of the second substrate 200b. Accordingly, as shown in FIG. 4, the reflectance ① of the green light G and the blue light B at (e.g., in or on) the lower surface of the second substrate 200b may be about 4% to about 8%.

The first anti-reflection layer 340a for transmitting red light R may be in contact with the lower surface of the second substrate 200b. Accordingly, as shown in FIG. 5, the reflectance ② of the red light R at (e.g., in or on) the lower surface of the second substrate 200b may be about 4% to about 8%.

Figure 6:
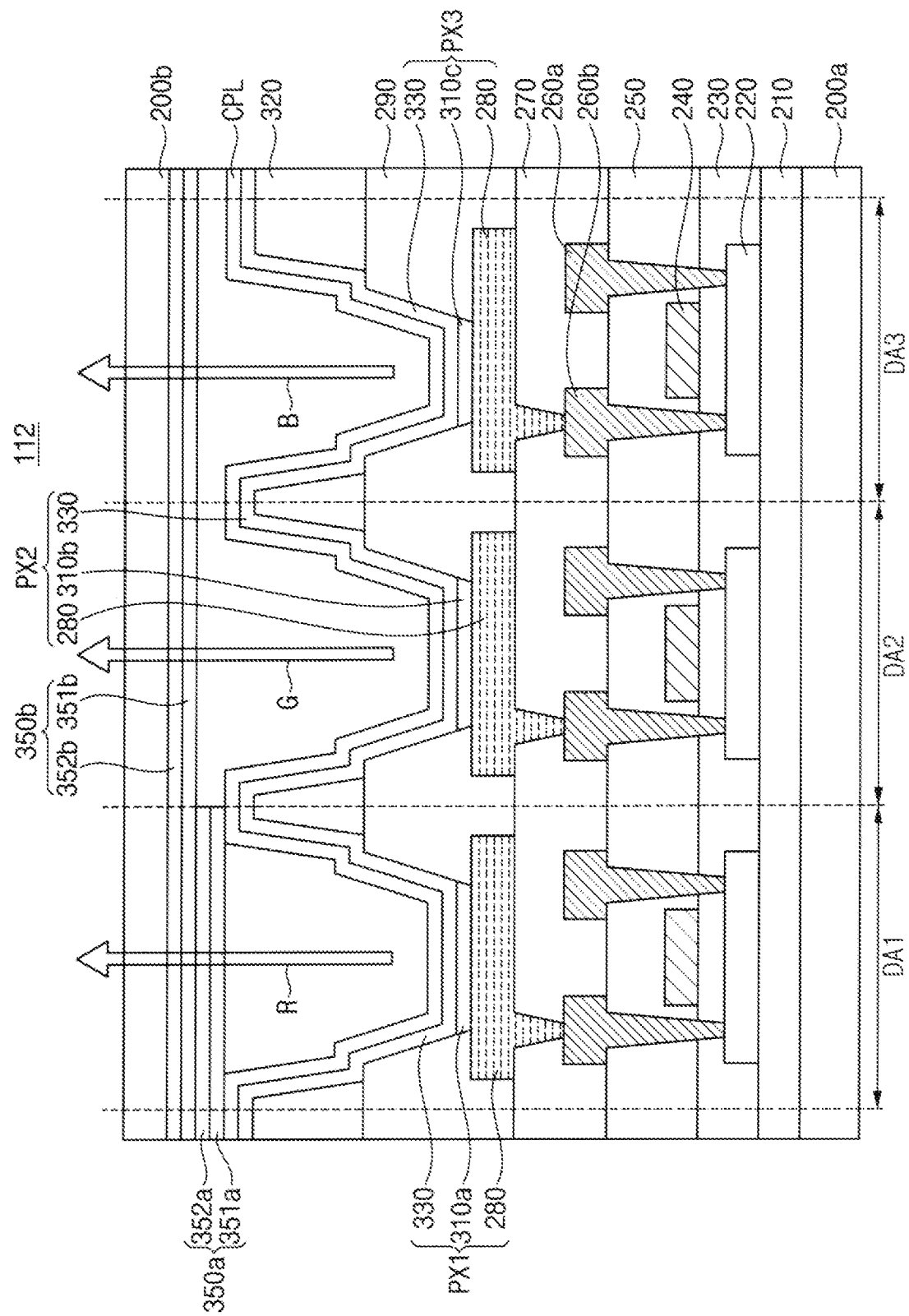
FIG. 6 is a cross-sectional view illustrating another example of a display unit included in the display device of FIG. 1.
Figure 7:
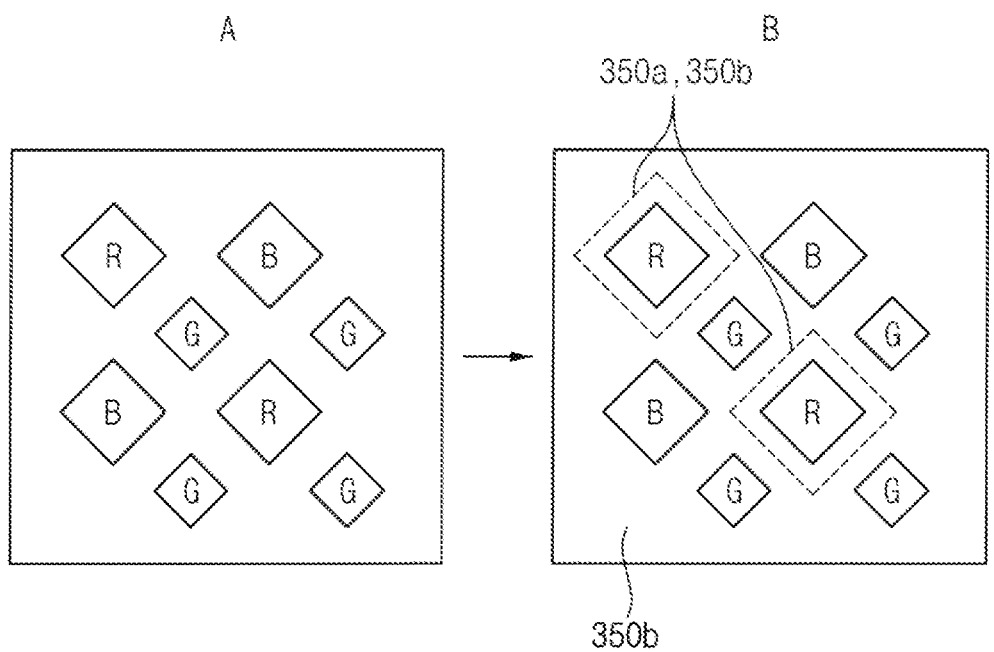
FIG. 7 is a plan view illustrating the display unit of FIG. 6.

FIG. 6 is a cross-sectional view illustrating another example of a display unit included in the display device of FIG. 1. FIG. 7 is a plan view illustrating the display unit of FIG. 6.

Referring to FIG. 6, a display unit (e.g., a display panel or a display layer) 112 may include a first substrate 200a, a source electrode 260a, a drain electrode 260b, a buffer layer 210, an active layer 220, a gate electrode 240, a gate insulating layer 230, an interlayer insulating layer 250, a via layer 270, a lower electrode 280, first to third emission layers 310a, 310b, and 310c, an upper electrode 330, a capping layer CPL, a pixel defining layer 290, a spacer 320, a second substrate 200b, a first anti-reflection layer 350a, and a second anti-reflection layer 350b. However, the display unit 112 may be the same or substantially the same as the display unit 111 described above with reference to FIG. 2, except for the first anti-reflection layer 350a and the second anti-reflection layer 350b may be different. Hereinafter, the first anti-reflection layer 350a and the second anti-reflection layer 350b of FIG. 6 may be mainly described in more detail.

As shown in FIG. 7, an enlarged view A may be a plan view of the display device 100 before the first anti-reflection layer 350a and the second anti-reflection layer 350b are disposed on the capping layer CPL, and an enlarged view B may be a plan view of the display device 100 after the first anti-reflection layer 350a and the second anti-reflection layer 350b are disposed on the capping layer CPL.

In an embodiment, the first anti-reflection layer 350a may overlap with the first area DA1, and the second anti-reflection layer 350b may overlap with the first area DA1, the second area DA2, and the third area DA3. In other words, the first anti-reflection layer 350a may overlap with the second anti-reflection layer 350b at (e.g., in or on) the first area DA1. The first anti-reflection layer 350a may transmit light of a first color therethrough, and the second anti-reflection layer 350b may transmit light of the first color, light of a second color, and light of a third color therethrough. For example, the first anti-reflection layer 350a may transmit the red light R, and the second anti-reflection layer 350b may transmit the red light R, the green light G, and the blue light B.

In an embodiment, each of the first anti-reflection layer 350a and the second anti-reflection layer 350b may include a low refractive oxide, for example, such as silicon dioxide ("$SiO_2$") and/or the like. In another embodiment, each of the first anti-reflection layer 350a and the second anti-reflection layer 350b may include a high refractive oxide, for example, such as titanium dioxide ("$TiO_2$"), zirconium dioxide ("$ZrO_2$"), lithium niobate ("$LiNbO_3$"), lithium tantalate ("$LiTaO_3$"), lanthanum titanium ("$LaTiO_2$"), and/or the like.

In an embodiment, a material included in the first anti-reflection layer 350a and a material included in the second anti-reflection layer 350b may be different from each other.

In an embodiment, a thickness of the first anti-reflection layer 350a and a thickness of the second anti-reflection layer 350b may be different from each other. For example, the thickness of the first anti-reflection layer 350a may be greater than the thickness of the second anti-reflection layer 350b. In another embodiment, the thickness of the first anti-reflection layer 350a may be smaller than the thickness of the second anti-reflection layer 350b.

In another embodiment, the thickness of the first anti-reflection layer 350a and the thickness of the second anti-reflection layer 350b may be the same or substantially the same as each other. In this case, the refractive index of the first anti-reflection layer 350a and the refractive index of the second anti-reflection layer 350b may be different from each other.

At least one of the first anti-reflection layer 350a and/or the second anti-reflection layer 350b may include a plurality of layers. In an embodiment, the plurality of layers may have a stacked structure. For example, the first anti-reflection layer 350a may include a first layer 351a, and a second layer 352a disposed on the first layer 351a. The second anti-reflection layer 350b may include a third layer 351b, and a fourth layer 352b disposed on the third layer 351b. However, the present disclosure is not limited thereto.

The refractive indices of the plurality of layers may be different from one another. For example, a difference in the refractive indices at an interface of the plurality of layers may be about 0.1 or more.

The second substrate 200b may be disposed on the first anti-reflection layer 350a and the second anti-reflection layer 350b.

The first anti-reflection layer 350a may be in contact with the second anti-reflection layer 350b, and the second anti-reflection layer 350b may be in contact with the second substrate 200b. In more detail, the first anti-reflection layer 350a may be in contact with the lower surface of the second anti-reflection layer 350b, and the second anti-reflection layer 350b may be in contact with the lower surface of the second substrate 200b.

In an embodiment, the first anti-reflection layer 340a and the second anti-reflection layer 340b may be formed in a coated form or a film form on the lower surface of the second substrate 200b through a chemical vapor deposition ("CVD") process.

Figure 8:
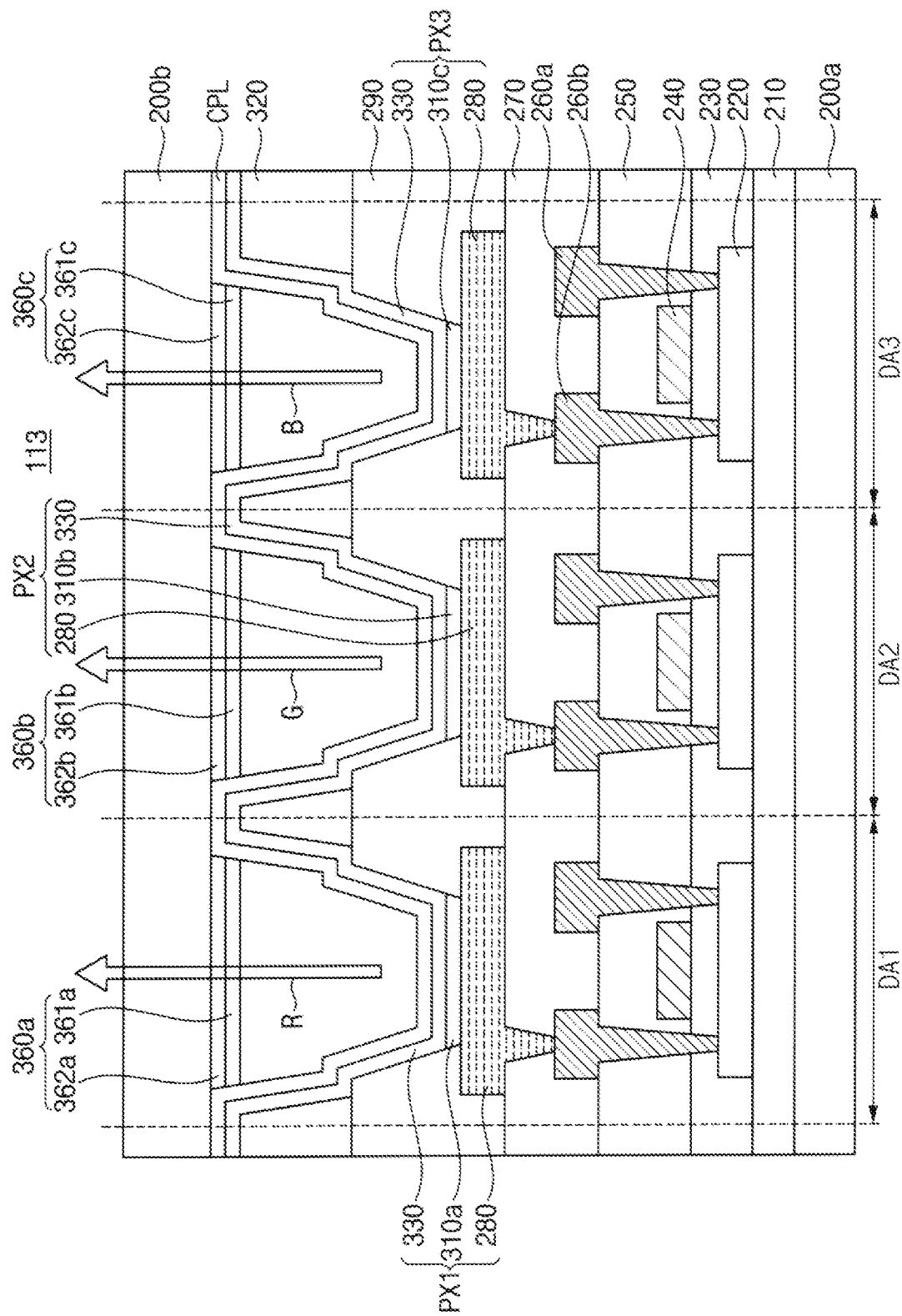
FIG. 8 is a cross-sectional view illustrating another example of a display unit included in the display device of FIG. 1.
Figure 9:
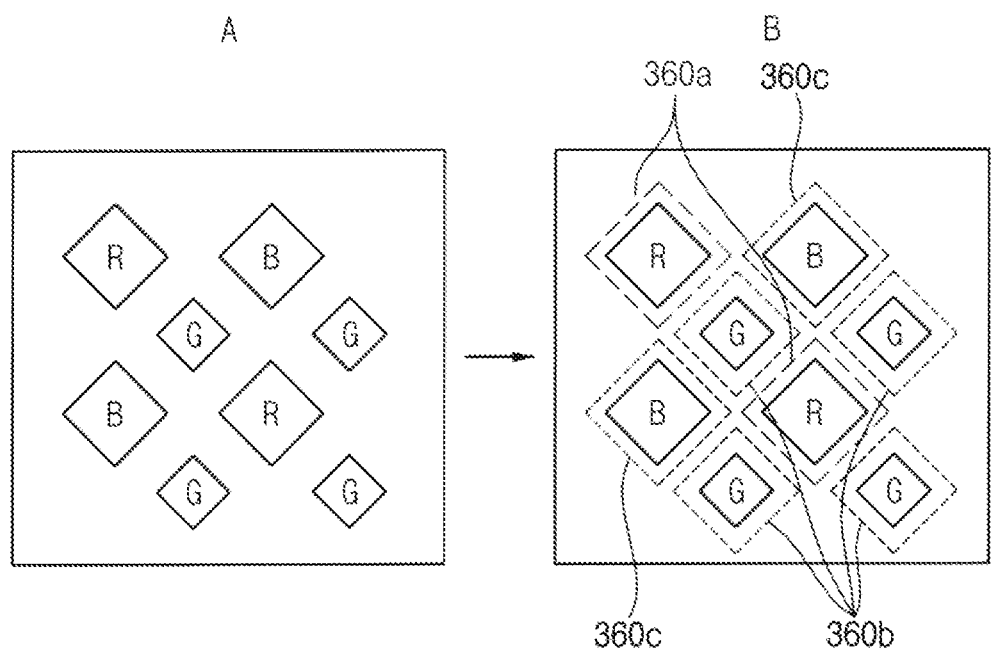
FIG. 9 is a plan view illustrating the display unit of FIG. 8.

FIG. 8 is a cross-sectional view illustrating another example of a display unit included in the display device of FIG. 1. FIG. 9 is a plan view illustrating the display unit of FIG. 8.

Referring to FIG. 8, a display unit (e.g., a display panel or a display layer) 113 may include a first substrate 200a, a source electrode 260a, a drain electrode 260b, a buffer layer 210, an active layer 220, a gate electrode 240, a gate insulating layer 230, an interlayer insulating layer 250, a via layer 270, a lower electrode 280, first to third emission layers 310a, 310b, and 310c, an upper electrode 330, a capping layer CPL, a pixel defining layer 290, a spacer 320, a second substrate 200b, a first anti-reflection layer 360a, a second anti-reflection layer 360b, and a third anti-reflection layer 360c. However, the display unit 113 may be the same or substantially the same as the display unit 111 described above with reference to FIG. 2, except for the first anti-reflection layer 360a, the second anti-reflection layer 360b, and the third anti-reflection layer 360c may be different. Hereinafter, the first anti-reflection layer 360a, the second anti-reflection layer 360b, and the third anti-reflection layer 360c may be mainly described in more detail.

In an embodiment, the first anti-reflection layer 360a, the second anti-reflection layer 360b, and the third anti-reflection layer 360c may be disposed on the capping layer CPL.

As shown in FIG. 9, an enlarged view A may be a plan view of the display device 100 before the first anti-reflection layer 360a, the second anti-reflection layer 360b, and the third anti-reflection layer 360c are disposed on the capping layer CPL, and an enlarged view B may be a plan view of the display device 100 after the first anti-reflection layer 360a, the second anti-reflection layer 360b, and the third anti-reflection layer 360c are disposed on the capping layer CPL.

In an embodiment, the first anti-reflection layer 360a may overlap with the first area DA1, the second anti-reflection layer 360b may overlap with the second area DA2, and the third anti-reflection layer The 360c may overlap with the third area DA3. The first anti-reflection layer 360a may transmit light of a first color therethrough, the second anti-reflection layer 360b may transmit light of a second color therethrough, and the third anti-reflection layer 360c may transmit light of a third color therethrough. For example, the first anti-reflection layer 360a may transmit the red light R, the second anti-reflection layer 360b may transmit green the light G, and the third anti-reflection layer 360c may transmit the blue light B.

In an embodiment, each of the first anti-reflection layer 360a, the second anti-reflection layer 360b, and the third anti-reflection layer 360c may include a low refractive oxide, for example, such as silicon dioxide ("$SiO_2$") and/or the like. In another embodiment, each of the first anti-reflection layer 360a, the second anti-reflection layer 360b, and the third anti-reflection layer 360c may include a high refractive oxide, for example, such as titanium dioxide ("$TiO_2$"), zirconium dioxide ("$ZrO_2$"), lithium niobate ("$LiNbO_3$"), lithium tantalate ("$LiTaO_3$"), lanthanum titanium ("$LaTiO_2$"), and/or the like.

In an embodiment, a material included in the first anti-reflection layer 360a, a material included in the second anti-reflection layer 360b, and a material included in the third anti-reflection layer 360c may be different from one another.

In an embodiment, a thickness of the first anti-reflection layer 360a, a thickness of the second anti-reflection layer 360b, and a thickness of the third anti-reflection layer 360c may be different from one another. For example, the first anti-reflection layer 360a may have the largest thickness. In another embodiment, the thickness of the second anti-reflection layer 360b may be the largest. In another embodiment, the thickness of the third anti-reflection layer 360c may the largest.

In another embodiment, the thickness of the first anti-reflection layer 360a, the thickness of the second anti-reflection layer 360b, and the thickness of the third anti-reflection layer 360c may be the same or substantially the same as each other. In this case, the refractive index of the first anti-reflection layer 360a, the refractive index of the second anti-reflection layer 360b, and the refractive index of the third anti-reflection layer 360c may be different from one another.

At least one of the first anti-reflection layer 360a, the second anti-reflection layer 360b, and/or the third anti-reflection layer 360c may include a plurality of layers. In an embodiment, the plurality of layers may have a stacked structure. For example, the first anti-reflection layer 360a may include a first layer 361a, and a second layer 362a disposed on the first layer. The second anti-reflection layer 360b may include a third layer 361b, and a fourth layer 362b disposed on the third layer 361b. The third anti-reflection layer 360c may include a fifth layer 361c, and a sixth layer 362c disposed on the fifth layer 361c. However, the present disclosure is not limited thereto.

The refractive indices of the plurality of layers may be different from one another. For example, a difference in the refractive indices at an interface of the plurality of layers may be 0.1 or more.

The second substrate 200b may be disposed on the first anti-reflection layer 360a, the second anti-reflection layer 360b, and the third anti-reflection layer 360c.

The first anti-reflection layer 360a, the second anti-reflection layer 360b, and the third anti-reflection layer 360c may contact the second substrate 200b. In more detail, the first anti-reflection layer 360a, the second anti-reflection layer 360b, and the third anti-reflection layer 360c may contact the lower surface of the second substrate 200b.

In an embodiment, the first anti-reflection layer 360a, the second anti-reflection layer 360b, and the third anti-reflection layer 360c may be formed in a coated form or a film form on the lower surface of the second substrate 200*b* through a chemical vapor deposition ("CVD") process.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display device comprising:
   a first substrate comprising a first region, a second region adjacent to the first region, and a third region adjacent to the second region;
   a plurality of emission layers on the first substrate;
   a first anti-reflection layer on at least one of the plurality of emission layers, and overlapping with the first region while being offset from at least one of the second region or the third region in a direction parallel to a surface of the first substrate, the first anti-reflection layer being configured to transmit a first colored light;
   a second anti-reflection layer on at least one of the plurality of emission layers, and configured to transmit a second colored light and a third colored light that are different from the first colored light; and
   a second substrate on the first anti-reflection layer and the second anti-reflection layer.

2. The display device of claim 1, wherein the plurality of emission layers comprise:
   a first emission layer configured to emit red light, and overlapping with the first region;
   a second emission layer configured to emit green light, and overlapping with the second region; and
   a third emission layer configured to emit blue light, and overlapping with the third region.

3. A display device comprising:
   a first substrate comprising a first region, a second region adjacent to the first region, and a third region adjacent to the second region;
   a plurality of emission layers on the first substrate;
   a first anti-reflection layer on at least one of the plurality of emission layers, and configured to transmit a first colored light;
   a second anti-reflection layer on at least one of the plurality of emission layers, and configured to transmit a second colored light and a third colored light that are different from the first colored light; and
   a second substrate on the first anti-reflection layer and the second anti-reflection layer,
   wherein the plurality of emission layers comprise:
   a first emission layer configured to emit red light, and overlapping with the first region;
   a second emission layer configured to emit green light, and overlapping with the second region; and
   a third emission layer configured to emit blue light, and overlapping with the third region, and
   wherein:
   the first anti-reflection layer overlaps with the first region, and contacts the second substrate; and
   the second anti-reflection layer overlaps with the second region and the third region, and contacts the second substrate.

4. The display device of claim 3, wherein the first color is red, the second color is green, and the third color is blue.

5. The display device of claim 2, wherein:
   the first anti-reflection layer overlaps with the first region, and contacts the second anti-reflection layer; and
   the second anti-reflection layer overlaps with the first region, the second region, and the third region, and contacts the second substrate.

6. The display device of claim 5, wherein the second anti-reflection layer is further configured to transmit the first colored light.

7. The display device of claim 5, wherein the first color is red, the second color is green, and the third color is blue.

8. The display device of claim 1, wherein a material included in the first anti-reflection layer and a material included in the second anti-reflection layer are different from each other.

9. The display device of claim 1, wherein a thickness of the first anti-reflection layer and a thickness of the second anti-reflection layer are different from each other.

10. The display device of claim 1, wherein a thickness of the first anti-reflection layer and a thickness of the second anti-reflection layer are the same as each other.

11. The display device of claim 1, wherein at least one of the first anti-reflection layer or the second anti-reflection layer comprise a plurality of layers.

12. The display device of claim 11, wherein the plurality of layers have different refractive indices from one another.

13. A display device comprising:
   a first substrate comprising a first region, a second region adjacent to the first region, and a third region adjacent to the second region;
   a plurality of emission layers on the first substrate;
   a first anti-reflection layer on at least one of the plurality of emission layers, and configured to transmit a first colored light;
   a second anti-reflection layer on at least one of the plurality of emission layers, and configured to transmit a second colored light that is different from the first colored light;
   a third anti-reflection layer on at least one of the plurality of emission layers, and configured to transmit a third colored light that is different from the first colored light and the second colored light; and
   a second substrate on the first anti-reflection layer, the second anti-reflection layer, and the third anti-reflection layer,
   wherein each of the first, second, and third anti-reflection layers contacts the second substrate.

14. The display device of claim 13, wherein the plurality of emission layers comprise:
   a first emission layer configured to emit red light, and overlapping with the first region;
   a second emission layer configured to emit green light, and overlapping with the second region; and
   a third emission layer configured to emit blue light, and overlapping with the third region.

15. The display device of claim 14, wherein:
the first anti-reflection layer overlaps with the first region, and contacts the second substrate;
the second anti-reflection layer overlaps with the second region, and contacts the second substrate; and
the third anti-reflection layer overlaps with the third region, and contacts the second substrate.

16. The display device of claim 15, wherein the first color is red, the second color is green, and the third color is blue.

17. The display device of claim 13, wherein a material included in the first anti-reflection layer, a material included in the second anti-reflection layer, and a material included in the third anti-reflection layer are different from one another.

18. The display device of claim 13, wherein a thickness of the first anti-reflection layer, a thickness of the second anti-reflection layer, and a thickness of the third anti-reflection layer are different from one another.

19. The display device of claim 13, wherein a thickness of the first anti-reflection layer, a thickness of the second anti-reflection layer, and a thickness of the third anti-reflection layer are the same as each other.

20. The display device of claim 13, wherein:
at least one of the first anti-reflection layer, the second anti-reflection layer, or the third anti-reflection layer comprise a plurality of layers; and
the plurality of layers have different refractive indices from one another.

* * * * *